US012803552B2

(12) United States Patent
Sung et al.

(10) Patent No.: US 12,803,552 B2
(45) Date of Patent: Nov. 17, 2026

(54) RF SWITCH WITH TWO-STEP SWITCHABLE LOW DROPOUT REGULATOR

(71) Applicant: BeRex Corporation Co., Ltd, Seoul (KR)

(72) Inventors: Ho Sung Sung, Gwangju-si (KR); Tae Won Jung, Seoul (KR); Hun Kim, Seoul (KR)

(73) Assignee: BeRex Corporation Co., Ltd, Seoul (KR)

( * ) Notice: Subject to any disclaimer, the term of this patent is extended or adjusted under 35 U.S.C. 154(b) by 2 days.

(21) Appl. No.: 19/097,637

(22) Filed: Apr. 1, 2025

(65) Prior Publication Data

US 2026/0172026 A1 Jun. 18, 2026

(30) Foreign Application Priority Data

Dec. 16, 2024 (KR) ........................ 10-2024-0187215

(51) Int. Cl.
*H03K 17/687* (2006.01)
*G05F 1/575* (2006.01)

(52) U.S. Cl.
CPC ......... *H03K 17/6871* (2013.01); *G05F 1/575* (2013.01)

(58) Field of Classification Search
CPC ............ G05F 1/565; G05F 1/575; G05F 1/56; H03K 17/687; H03K 17/162
See application file for complete search history.

(56) References Cited

U.S. PATENT DOCUMENTS

| | | | | |
|---|---|---|---|---|
| 12,613,542 | B2 * | 4/2026 | Park | G05F 1/575 |
| 2018/0120875 | A1 * | 5/2018 | Suzuki | H03K 17/08 |
| 2026/0010188 | A1 * | 1/2026 | Wang | G05F 1/573 |
| 2026/0149362 | A1 * | 5/2026 | Takano | H02M 1/32 |

FOREIGN PATENT DOCUMENTS

KR 102029490 B1 10/2019

* cited by examiner

*Primary Examiner* — Patrick C Chen
(74) *Attorney, Agent, or Firm* — Foley & Lardner LLP

(57) ABSTRACT

The present disclosure relates to an RF switch with a two-step switchable low dropout regulator LDO. The RF switch may automatically vary an output voltage even when a power supply voltage $V_{DD}$(IN) decreases so that the low dropout regulator LDO always operates within an operating voltage range, thereby reducing noise coming into the power supply and reducing intermodulated clock noise of a negative voltage generator from flowing into the power supply. The RF switch is configured to include the low dropout regulator LDO which enables an LDO output VLDO to operate in a two-step switchable manner even when the voltage of the power supply voltage decreases and a low voltage lockout (UVLO: Under Voltage Lock Out), wherein the low voltage lockout UVLO may monitor the power supply voltage $V_{DD}$(IN).

1 Claim, 9 Drawing Sheets

RF SWITCH WITH TWO-STEP SWITCHABLE LOW DROPOUT REGULATOR

CROSS-REFERENCE TO RELATED PATENT APPLICATIONS

This application claims priority to Korean Patent Application No. 10-2024-0187215, filed Dec. 16, 2024, which is incorporated herein by reference in its entirety.

TECHNICAL FIELD

The present disclosure relates to a radio frequency (RF) switch with a two-step switchable low dropout regulator (LDO), and more particularly, to an RF switch which is insensitive to power supply noise and has the characteristic of reducing intermodulated clock noise (clock feedthrough by an oscillator and/or noise spurs caused by a negative charge pump) of an internal negative voltage generator (NVG).

BACKGROUND

Generally, a switch control device that outputs a switch control signal to a high-frequency switch may use a voltage regulator to stably control the switch control signal. Particularly, among voltage regulators, a low dropout type voltage regulator, which can down-convert a power supply voltage, can be designed simply, and can reduce current consumption may be used.

A conventional N-channel metal-oxide semiconductor (NMOS) device for a radio frequency (RF) switch in the silicon on insulator (SOI) process has the switching performance optimized for +2.5 V/−2.5 V operation and the NMOS device for an RF switch is turned on or off using a 2.5 V low dropout regulator (LDO) and a −2.5 V negative voltage generator (NVG).

A conventional RF switch has a configuration as shown in FIG. 1A.

Referring to FIG. 1A, the NMOS device for an RF switch in the latest SOI process has a switching performance optimized for a +3.5 V/−3.5 V operation and a 3.5 V low dropout regulator LDO and a −3.5 V negative voltage generator NVG are used for turning the NMOS device for an RF switch on or off.

A typical range of a voltage of the power supply VDD(IN) of an RF switch is 2.7 V to 5.5 V.

As shown in FIG. 1B, in a case in which an NMOS device for an RF switch in the latest SOI process is used, when the power supply voltage VDD(IN) is from 2.7 V to 3.7 V, a P-channel metal-oxide semiconductor (PMOS) pass element of the low dropout regulator LDO with an output of 3.5 V is turned on so that power supply noise flows directly into the RF switch which makes it impossible to avoid performance degradation of the RF switch and the intermodulated clock noise (clock feedthrough by an oscillator and/or noise spurs caused by a negative charge pump) of the negative voltage generator NVG flows into the power supply, causing performance degradation in the RF system connected to the power supply.

In this way, when the voltage of the power supply VDD(IN) decreases, the PMOS Pass element of the low dropout regulator LDO is turned on. Thus, power supply noise impedes the performance of the RF switch and the intermodulated clock noise of the negative voltage generator flows into the power supply, causing issues in that it deteriorates the performance of the RF system connected to the power supply.

SUMMARY

The task that the present disclosure seeks to solve is to solve the above-described issues, and the present disclosure is directed to providing an RF switch with a two-step switchable low dropout regulator LDO which automatically varies an output voltage even when a power supply voltage is low so that the low dropout regulator LDO always operates within an operating voltage range, thereby reducing performance degradation of the RF switch and performance degradation of an RF system.

An RF switch with a two-step switchable low dropout regulator LDO according to a first aspect of the present disclosure for realizing the purpose may include:

the low dropout regulator LDO which includes an amplifier Amp which outputs a gate signal in accordance with a difference voltage between a reference voltage VBGR and a feedback voltage, a P-channel metal-oxide semiconductor (PMOS) transistor PMOS which controls current between an input terminal IN which receives a power supply voltage $V_{DD}$(IN) in accordance with a gate signal and a ground, a fixed resistor $R_1$ which may control an output voltage, and a variable resistor $R_2$ which is controlled using an external output signal UV; and a low voltage lockout UVLO which includes a resistor $R_T$ having one side to which a power supply is connected, a resistor $R_B$ whose one side is connected in series to the other side of the resistor $R_T$, a resistor $R_H$ whose one side is connected in series to the other side of the resistor $R_B$ and whose other side is grounded, a comparator 1 in which a voltage between the resistor $R_T$ and the resistor $R_B$ is input to an inverting input terminal, in which a reference voltage $V_{BGR}$ is input to a non-inverting input terminal, and which outputs a signal for controlling the variable resistor, and an N-channel metal-oxide semiconductor (NMOS) transistor NMOS in which a drain is connected between the resistor $R_B$ and the resistor $R_H$, a source is grounded, and an output of the comparator 1 is input to a gate so that the NMOS transistor NMOS is turned on/off, wherein the low voltage lockout UVLO monitors the power supply voltage $V_{DD}$(IN) and outputs the monitored signal.

An RF switch with a two-step switchable low dropout regulator LDO according to a second aspect of the present disclosure for realizing the purpose may include:

the low dropout regulator LDO which includes an amplifier Amp which outputs a gate signal in accordance with a difference voltage between a reference voltage VBGR and a feedback voltage, a PMOS transistor PMOS which controls current between an input terminal IN which receives a power supply voltage $V_{DD}$(IN) in accordance with a gate signal and a ground, a fixed resistor $R_1$ which may adjust an output voltage, and a variable resistor $R_2$ which is controlled using an external output signal UV; and a low voltage lockout UVLO which includes a resistor $R_T$ having one side to which a power supply is connected, a resistor $R_B$ whose one side is connected in series to the other side of the resistor $R_T$ and whose other side is grounded, a resistor $R_H$ whose one side is connected to a contact point of the resistor $R_B$ and the resistor $R_T$, a comparator 1 in which a voltage between the resistor $R_T$ and the resistor $R_B$ is input to an inverting input terminal, in which a reference voltage $V_{BGR}$ is input to a non-inverting input terminal, and which outputs a signal for controlling the variable resistor, and an NMOS transistor NMOS in which a drain is connected to the other side of the resistor $R_H$, a source is grounded, and an output of the comparator 1 is input to a gate so that the NMOS transistor NMOS is turned on/off, wherein the low voltage lockout UVLO monitors the power supply voltage $V_{DD}$(IN) and outputs the monitored signal.

An RF switch with a two-step switchable low dropout regulator LDO according to a third aspect of the present disclosure for realizing the purpose may include:

the low dropout regulator LDO which includes an amplifier Amp which outputs a gate signal in accordance with a difference voltage between a reference voltage VBGR and a feedback voltage, a PMOS transistor PMOS which controls current between an input terminal IN which receives a power supply voltage VDD (IN) in accordance with a gate signal and a ground, a fixed resistor R1 which may adjust an output voltage, and a variable resistor R2 which is controlled using an external output signal UV; and a low voltage lockout UVLO which includes a resistor $R_T$ having one side to which a power supply is connected, a resistor $R_B$ whose one side is connected in series to the other side of the resistor $R_T$ and whose other side is grounded, a current source $I_H$ whose one side is connected to a contact point of the resistor $R_B$ and the resistor $R_T$, a comparator 1 in which a voltage between the resistor $R_T$ and the resistor $R_B$ is input to an inverting input terminal, in which a reference voltage VBGR is input to a non-inverting input terminal, and which outputs a signal for controlling the variable resistor, and an NMOS transistor NMOS in which a drain is connected to an output side of the current source IH, a source is grounded, and an output of the comparator 1 is input to a gate so that the NMOS transistor NMOS is turned on/off, wherein the low voltage lockout UVLO monitors the power supply voltage $V_{DD}$(IN) and outputs the monitored signal.

An RF switch with a two-step switchable low dropout regulator LDO according to a fourth aspect of the present disclosure for realizing the purpose may include:

the low dropout regulator LDO which has a fixed resistor $R_1$ which may adjust an output voltage of the low dropout regulator LDO and a variable resistor $R_2$ which is controlled using an output signal of a low voltage lockout UVLO and has a Class-AB output stage; and the low voltage lockout UVLO which includes a resistor $R_T$ having one side to which a power supply is connected, a resistor $R_B$ whose one side is connected in series to the other side of the resistor $R_T$, a resistor $R_H$ whose one side is connected in series to the other side of the resistor $R_B$ and whose other side is grounded, a comparator 1 in which a voltage between the resistor $R_T$ and the resistor $R_B$ is input to an inverting input terminal, in which a reference voltage $V_{BGR}$ is input to a non-inverting input terminal, and which outputs a signal for controlling the variable resistor, and an NMOS transistor NMOS in which a drain is connected between the resistor $R_B$ and the resistor $R_H$, a source is grounded, and an output of the comparator 1 is input to a gate so that the NMOS transistor NMOS is turned on/off, wherein the low voltage lockout UVLO monitors the power supply voltage $V_{DD}$(IN) and outputs the monitored signal.

An RF switch with a two-step switchable low dropout regulator LDO according to a fifth aspect of the present disclosure for realizing the purpose may include:

the low dropout regulator LDO which has a fixed resistor $R_1$ which can adjust an output voltage of the low dropout regulator LDO and a variable resistor $R_2$ which is controlled using an output signal of a low voltage lockout UVLO and has a Class-AB output stage; and the low voltage lockout UVLO which includes a resistor $R_T$ having one side to which a power supply is connected, a resistor $R_B$ whose one side is connected in series to the other side of the resistor $R_T$ and whose other side is grounded, a resistor $R_H$ whose one side is connected to a contact point of the resistor $R_B$ and the resistor $R_T$, a comparator 1 in which a voltage between the resistor $R_T$ and the resistor $R_B$ is input to an inverting input terminal, in which a reference voltage $V_{BGR}$ is input to a non-inverting input terminal, and which outputs a signal for controlling the variable resistor, and an NMOS transistor NMOS in which a drain is connected to the other side of the resistor $R_H$, a source is grounded, and an output of the comparator 1 is input to a gate so that the NMOS transistor NMOS is turned on/off, and wherein the low voltage lockout UVLO monitors the power supply voltage $V_{DD}$(IN) and outputs the monitored signal.

An RF switch with a two-step switchable low dropout regulator LDO according to a sixth aspect of the present disclosure for realizing the purpose may include:

the low dropout regulator LDO which has a fixed resistor $R_1$ which may adjust an output voltage of the low dropout regulator LDO and a variable resistor $R_2$ which is controlled using an output signal of a low voltage lockout UVLO and has a Class-AB output stage; and the low voltage lockout UVLO which includes a resistor $R_T$ having one side to which a power supply is connected, a resistor $R_B$ whose one side is connected in series to the other side of the resistor $R_T$ and whose other side is grounded, a current source $I_H$ whose one side is connected to a contact point of the resistor $R_B$ and the resistor $R_T$, a comparator 1 in which a voltage between the resistor $R_T$ and the resistor $R_B$ is input to an inverting input terminal, in which a reference voltage $V_{BGR}$ is input to a non-inverting input terminal, and which outputs a signal for controlling the variable resistor, and an NMOS transistor NMOS in which a drain is connected to an output side of the current source $I_H$, a source is grounded, and an output of the comparator 1 is input to a gate so that the NMOS transistor NMOS is turned on/off, wherein the low voltage lockout UVLO monitors the power supply voltage $V_{DD}$(IN) and outputs the monitored signal.

In an embodiment of the present disclosure, by means of the above-described configuration, the output voltage is automatically varied even when a power supply voltage $V_{DD}$(IN) decreases so that the low dropout regulator LDO always operates within an operating voltage range, thereby reducing noise coming into the power supply and reducing intermodulated clock noise of the negative voltage generator from flowing into the power supply.

The effects of an embodiment of the present disclosure are not limited to the effects mentioned above and other effects not described will be clearly understood by those skilled in the art from the description below.

BRIEF DESCRIPTION OF THE DRAWINGS

The accompanying drawings which are incorporated in and constitute a part of this specification show one or more embodiments of the present disclosure and, together with the description of an embodiment, serve to explain the principles and implementations of the present disclosure.

DETAILED DESCRIPTION

Figure 1A:
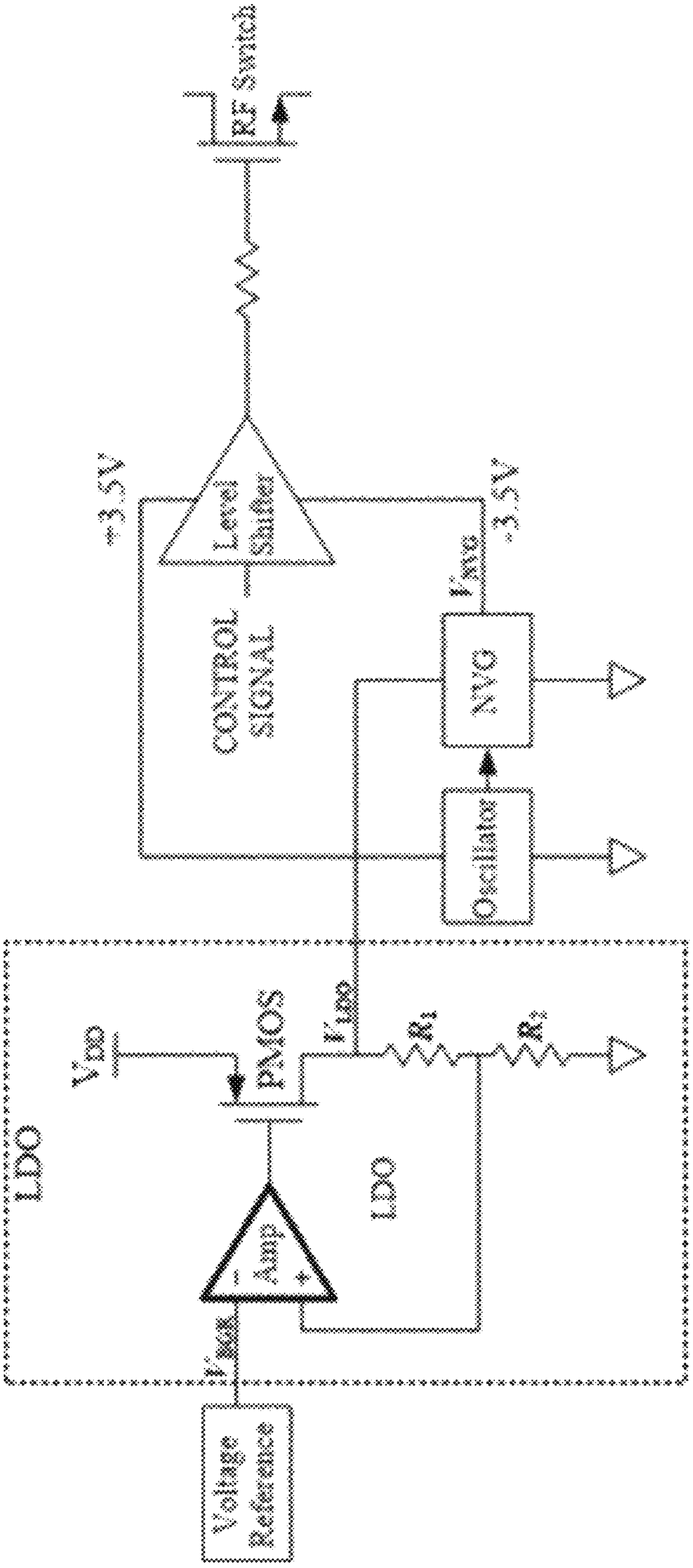
FIG. 1A shows a configuration of a conventional radio frequency (RF) switch.
Figure 1B:
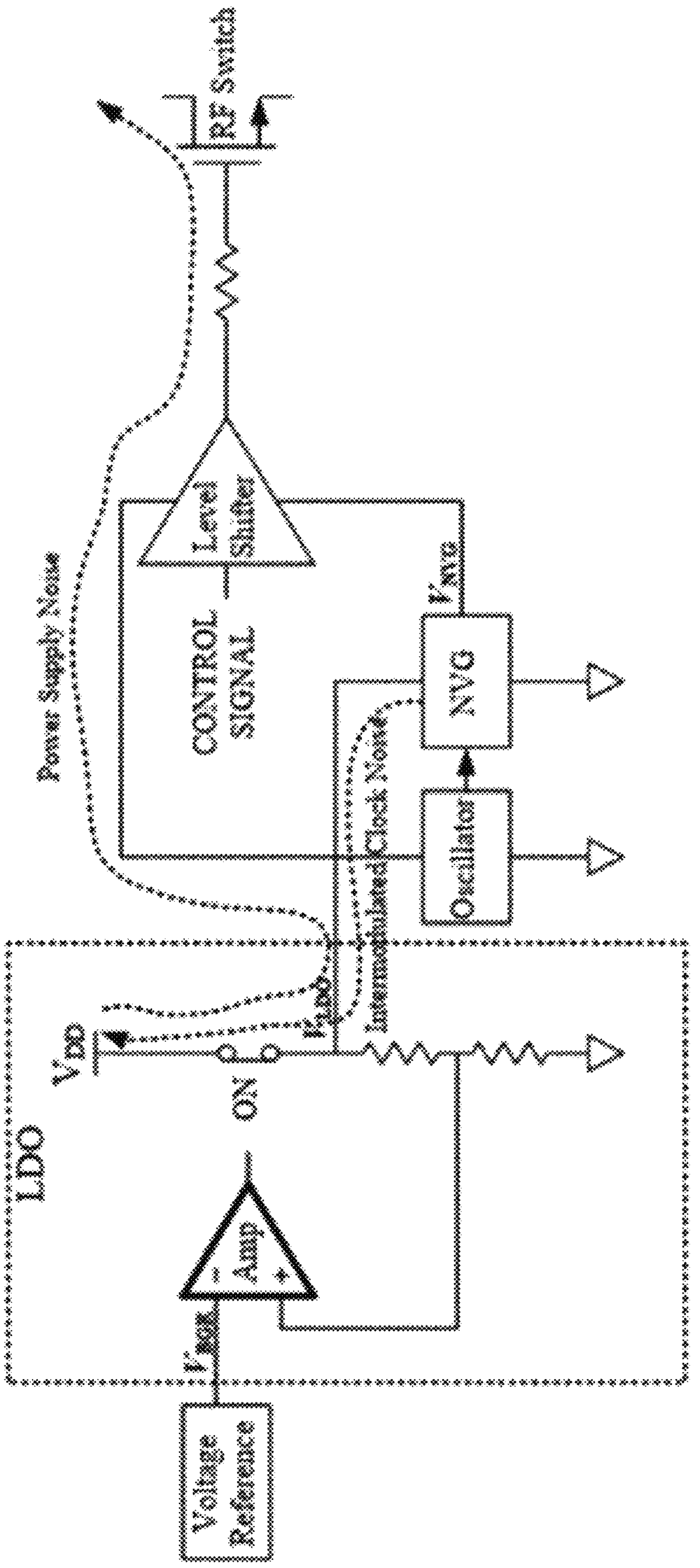
FIG. 1B shows problems of a conventional RF switch.

An embodiment of the present disclosure is described in detail below with reference to the attached drawings so that a person having ordinary skill in the art to which the present disclosure belongs may easily practice the present disclosure. Here, the present disclosure may be implemented in many different forms and is not limited to an embodiment described herein. And, in order to clearly explain the present disclosure in the drawings, parts which are not related to the explanation have been omitted and the same constituent elements are denoted by the same drawing symbols throughout the specification.

When a part of a specification is said to “include” a constituent element, this does not mean that it excludes other constituent elements, but rather that it may include other constituent elements, unless otherwise stated.

The present disclosure may be implemented in many different forms and is not limited to an embodiment described herein and parts of the drawings which are not relevant to the description are omitted.

Figure 2A:
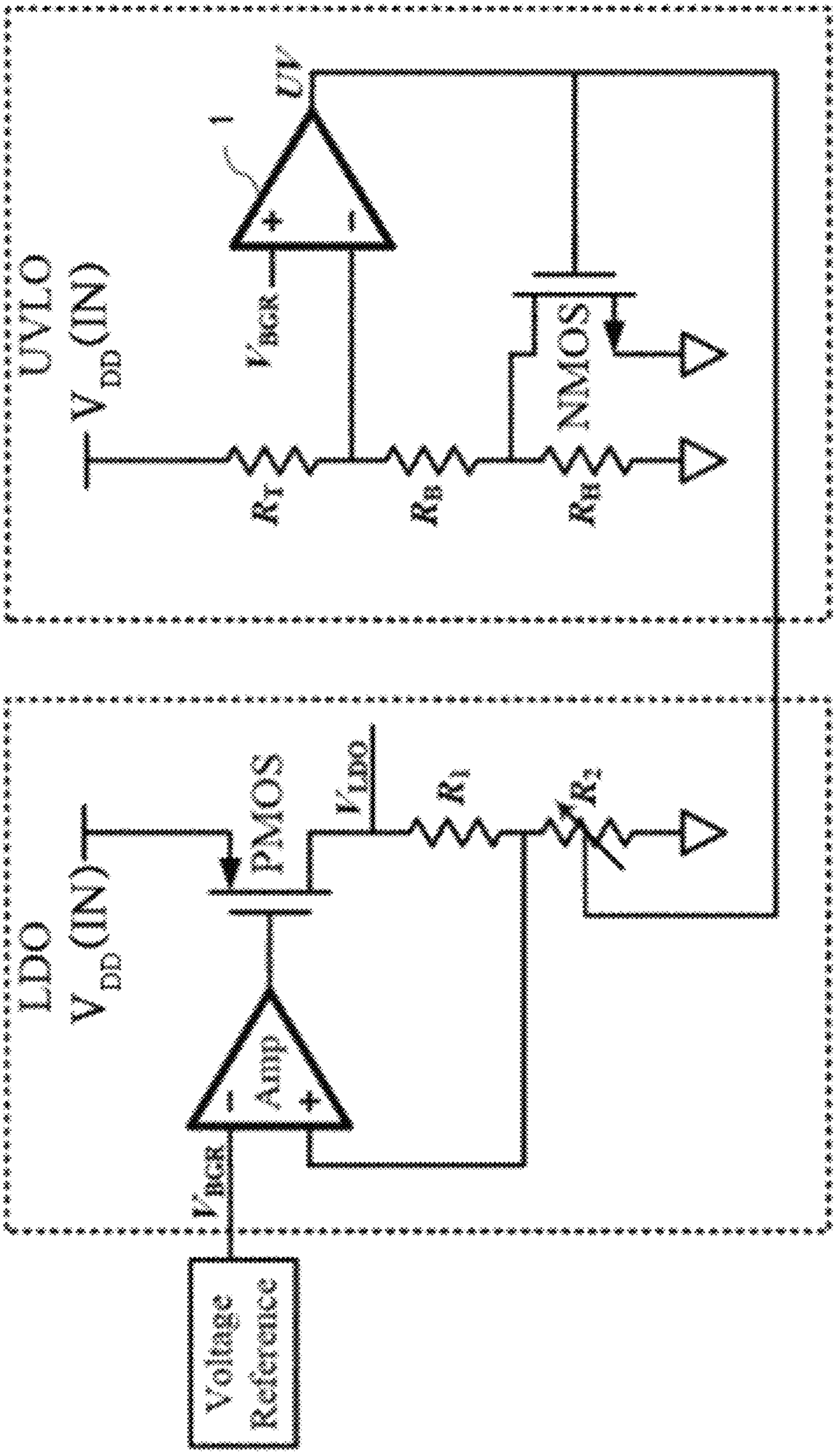
FIG. 2A shows a configuration of a two-step switchable low dropout regulator LDO according to a first embodiment of the present disclosure.

FIG. 2A shows a configuration of a two-step switchable low dropout regulator LDO according to a first embodiment of the present disclosure.

Referring to FIG. 2A, an RF switch with a two-step switchable low dropout regulator LDO according to the first embodiment of the present disclosure may include:

- a low dropout regulator LDO which includes an amplifier Amp which outputs a gate signal in accordance with a difference between a reference voltage $V_{BGR}$ and a feedback voltage, a PMOS transistor PMOS which controls current between an input terminal IN which receives a power supply voltage $V_{DD}$(IN) in accordance with the gate signal and the ground, a fixed resistor $R_1$ capable of adjusting an output voltage, and a variable resistor $R_2$ controlled using an external output signal UV; and
- a low voltage lockout UVLO which includes a resistor $R_T$ having one side connected to a power supply, a resistor $R_B$ whose one side is connected in series to the other side of the resistor $R_T$, a resistor $R_H$ whose one side is connected in series to the other side of the resistor $R_B$ and whose other side is grounded, a comparator 1 in which a voltage between the resistor $R_T$ and the resistor $R_B$ is input to an inverting input terminal, in which the reference voltage $V_{BGR}$ is input to a non-inverting input terminal, and which outputs a signal for controlling a variable resistor, and an NMOS transistor NMOS whose drain is connected between the resistor $R_B$ and the resistor $R_H$, whose source is grounded, and whose gate receives an output of the comparator 1 so that the NMOS transistor NMOS is turned on/off, wherein the low voltage lockout UVLO monitors the power supply voltage $V_{DD}$(IN) and outputs the monitored signal.

An operation of an RF switch with a two-step switchable low dropout regulator LDO according to the first embodiment of the present disclosure with such a configuration is as follows.

First, the amplifier Amp may be controlled so that the reference voltage $V_{BGR}$ and the feedback voltage become the same by providing a gate signal SG having a level corresponding to a difference voltage between the reference voltage $V_{BGR}$ and the feedback voltage.

Also, the PMOS transistor PMOS may control current between an input terminal receiving a power supply voltage $V_{DD}$(IN) and the ground in accordance with a gate signal. That is, a PMOS transistor PMOS may control a source-drain current in accordance with the gate signal.

An output voltage VLDO of the low dropout regulator LDO may be calculated as in the following Equation 1 and a desired output voltage may be created by varying the resistor R1 or the resistor R2.

$$V_{LDO} = V_{BGR} \times \left(1 + \frac{R1}{R2}\right) \quad \text{[Equation 1]}$$

Figure 4:
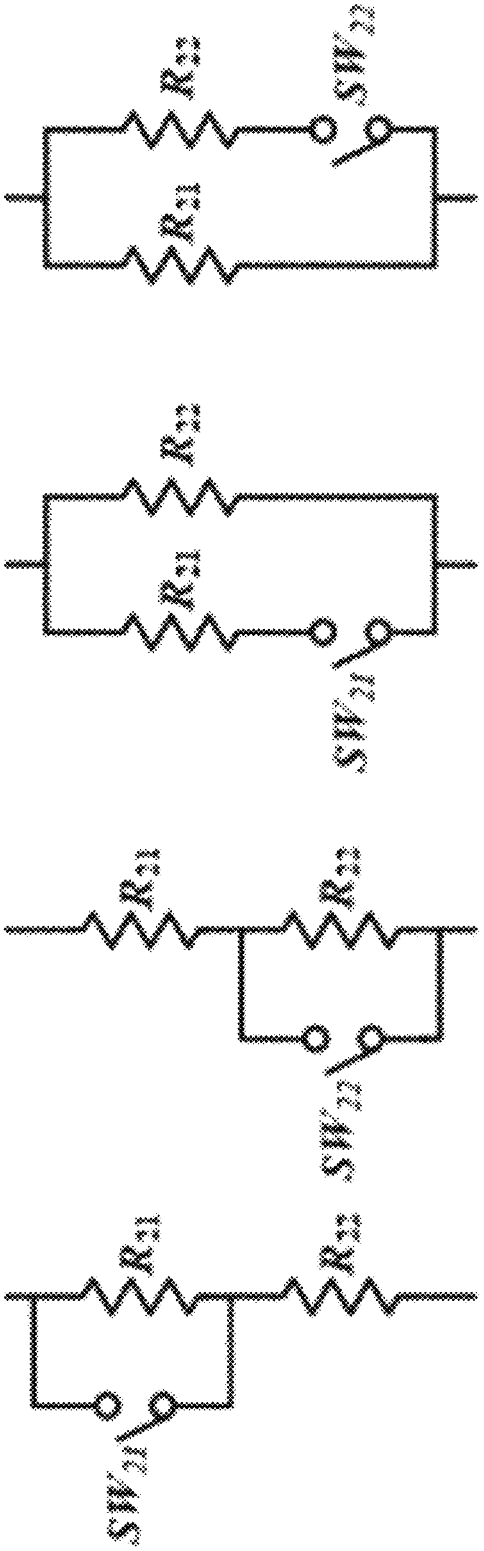
FIG. 4 shows various configurations of variable resistors used in an embodiment of the present disclosure.

The variable resistor $R_1$ or the variable resistor $R_2$ may be provided through a series-parallel combination of fixed resistors and switches as in the configuration of FIG. 4.

The low voltage lockout UVLO needs to use the comparator 1 with hysteresis to prevent oscillation due to power supply noise or needs to have a hysteresis function.

Referring to the low voltage lockout UVLO in FIG. 2A, when a power supply voltage $V_{DD}$(IN) is low (that is, 0 V), an output UV of the comparator 1 is high, the NMOS transistor NMOS is turned on and $R_H$ is connected in parallel with $R_B$. At this time, it is assumed that the on-resistance of the NMOS transistor NMOS is negligible compared to $R_H$ or is included in the value of $R_H$.

The configuration of the low voltage lockout UVLO in FIG. 2A may calculate a rising input threshold value VTR as in Equation 2.

$$V_{TR} = V_{BGR} \frac{R_t + R_B}{R_B} \quad \text{[Equation 2]}$$

And, a falling input threshold value VTF may be calculated as in Equation 3.

$$V_{TR} = V_{BGR}\frac{R_t + R_B + R_H}{R_B + R_H} \quad \text{[Equation 3]}$$

For example, if $V_{BGR}$, $R_T$, $R_B$, and $R_H$ are 1.15 V, 275 K, 100 K, and 15 K, respectively, the rising input threshold value $V_{TR}$ is 4.4 V and the falling input threshold value $V_{TF}$ is 3.9 V, which may create a low voltage lockout UVLO with 400 mV hysteresis.

Also, if a power supply voltage $V_{DD}$(IN) is higher than the rising input threshold value $V_{TR}$, the output voltage VLDO of the low dropout regulator LDO may be varied to 3.5 V by varying the resistor $R_2$, and if the power supply voltage $V_{DD}$(IN) is lower than the falling input threshold value $V_{TF}$, the output voltage VLDO of the low dropout regulator LDO may be varied to 2.5 V by varying the resistor $R_2$.

For example, an RF switch with a two-step switchable low dropout regulator LDO may be provided so that, when the power supply voltage $V_{DD}$(IN) is 4.4 V or higher, the output voltage VLDO of the low dropout regulator LDO is 3.5 V, and when the power supply voltage $V_{DD}$(IN) is 3.9 V or lower, the output voltage VLDO of the low dropout regulator LDO is 2.5 V.

The RF switch with a two-step switchable low dropout regulator LDO according to the first embodiment of the present disclosure includes the low dropout regulator LDO having the fixed resistor R1 which may adjust the output voltage of the low dropout regulator LDO and the variable resistor R2 which is controlled using the output signal UV of the low voltage lockout UVLO; and the low voltage lockout UVLO which monitors the power supply voltage $V_{DD}$(IN) and outputs the monitored signal UV. Thus, by automatically varying the output voltage even when the power supply voltage $V_{DD}$(IN) decreases, the low dropout regulator LDO may always operate within an operating voltage range (operating voltage range: 2.7 V to 5.5 V), which reduces noise coming into the power supply and reduces the intermodulated clock noise of the negative voltage generator from flowing into the power supply.

This first embodiment of the present disclosure is capable of various modifications and modifications with changed structures will be described below.

Figure 2B:
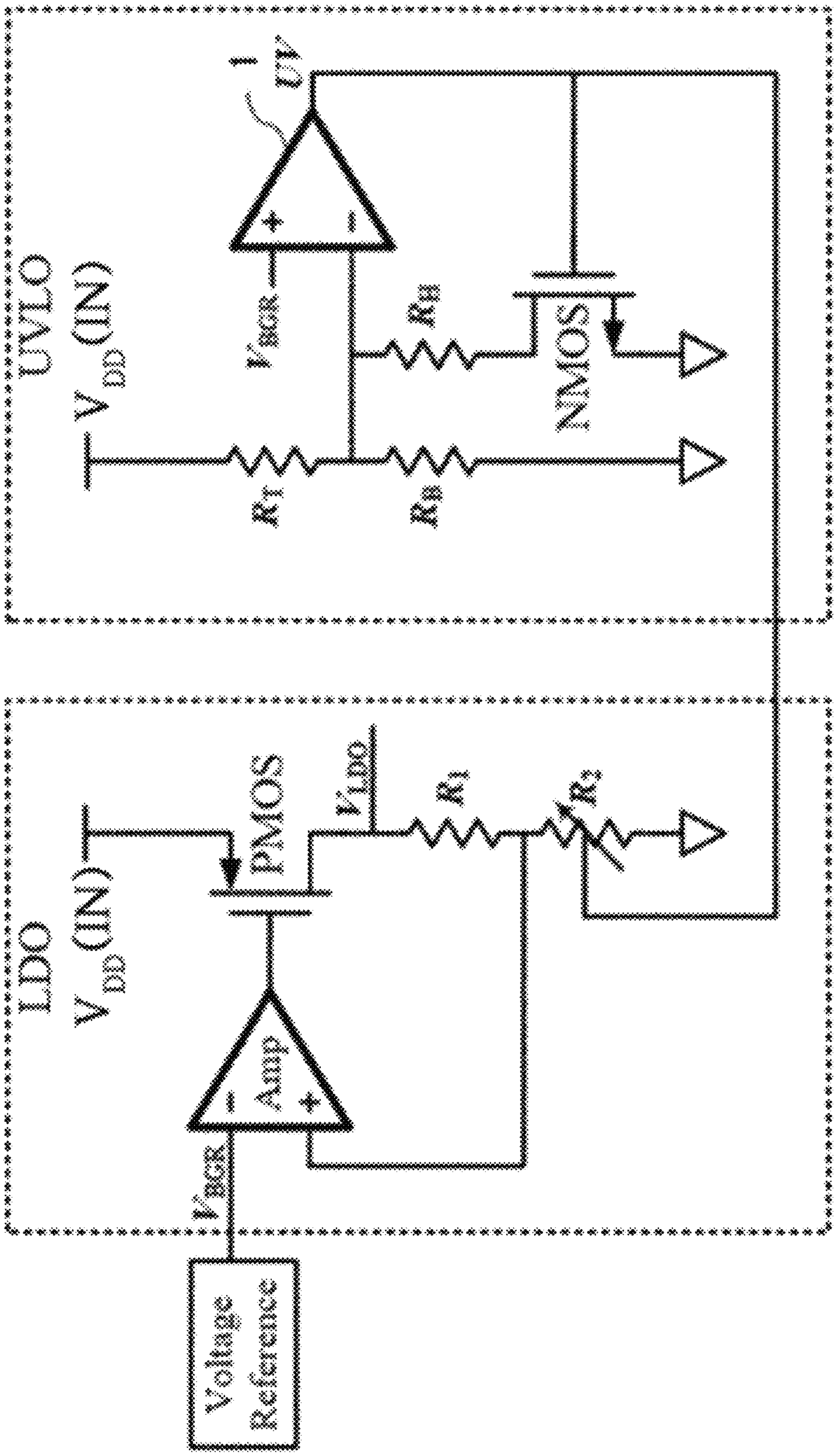
FIG. 2B shows a configuration of a two-step switchable low dropout regulator LDO according to a second embodiment of the present disclosure.

FIG. 2B shows a configuration of a two-step switchable low dropout regulator LDO according to a second embodiment of the present disclosure.

Referring to FIG. 2B, an RF switch with the two-step switchable low dropout regulator LDO according to the second embodiment of the present disclosure may include:

- a low dropout regulator LDO which includes an amplifier Amp which outputs a gate signal in accordance with a difference between a reference voltage VBGR and a feedback voltage, a PMOS transistor PMOS which controls current between an input terminal IN which receives a power supply voltage $V_{DD}$(IN) in accordance with the gate signal and the ground, a fixed resistor $R_1$ which may control an output voltage, and a variable resistor $R_2$ which is controlled using an external output signal UV; and
- a low voltage lockout UVLO which includes a resistor $R_T$ having one side to which the power supply is connected, a resistor $R_B$ whose one side is connected in series to the other side of the resistor $R_T$ and whose other side is grounded, a resistor $R_H$ whose one side is connected to a contact point of the resistor $R_B$ and the resistor $R_T$, a comparator in which a voltage between the resistor $R_T$ and the resistor $R_B$ is input to an inverting input terminal, in which a reference voltage $V_{BGR}$ is input to a non-inverting input terminal, and which outputs a signal for controlling the variable resistor, and an NMOS transistor NMOS in which a drain is connected to the other side of the resistor $R_H$, a source is grounded, and an output of the comparator 1 is input to a gate so that the NMOS transistor NMOS is turned on/off, wherein the low voltage lockout UVLO monitors the power supply voltage $V_{DD}$(IN) and outputs the monitored signal.

Referring to FIG. 2B, the RF switch with a two-step switchable low dropout regulator LDO of the second embodiment of the present disclosure is similar to the first embodiment, except that the drain of the NMOS transistor (NMOS) is connected to the other side of the resistor (RH) and the source is grounded.

Figure 2C:
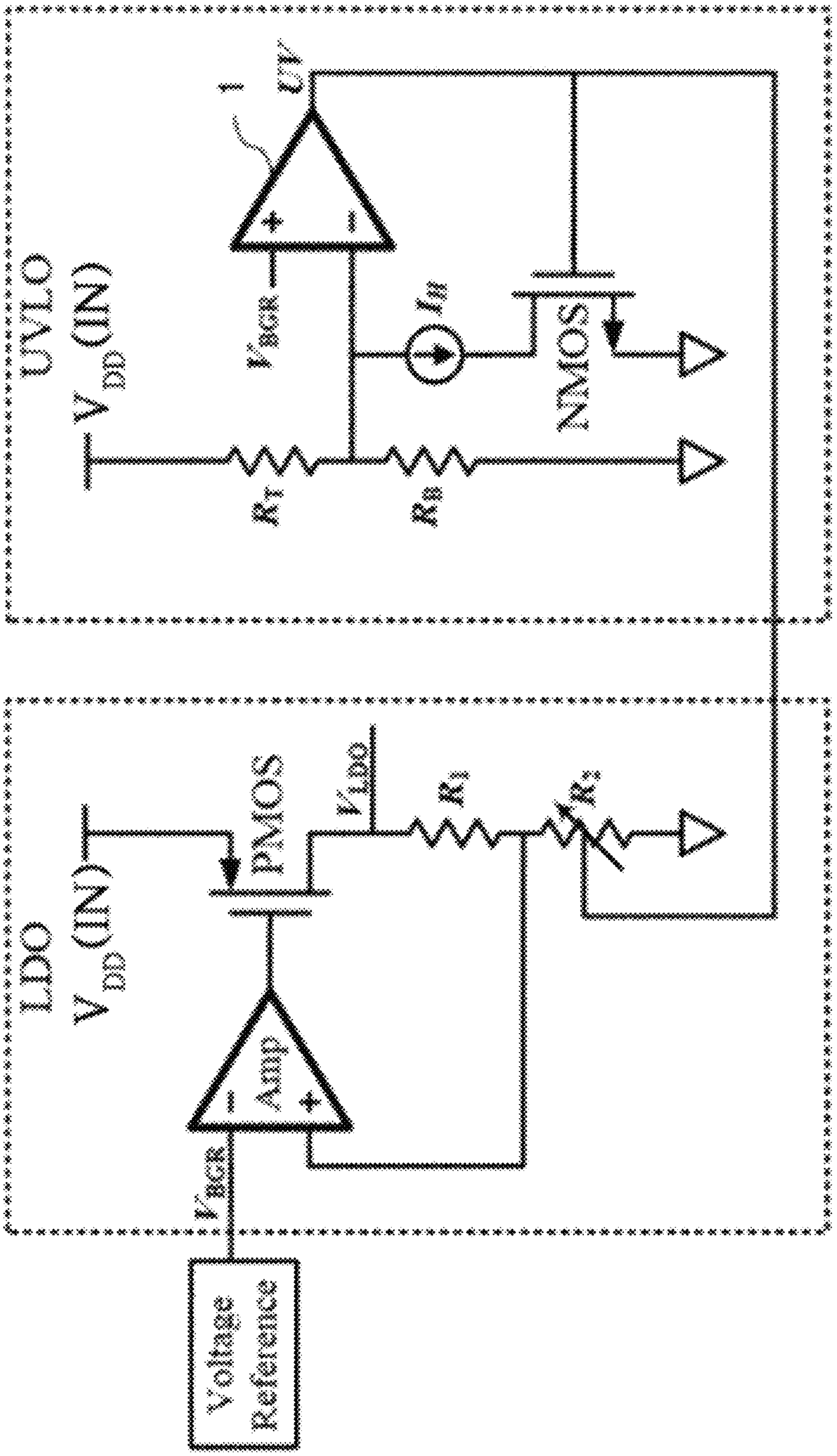
FIG. 2C shows a configuration of a two-step switchable low dropout regulator LDO according to a third embodiment of the present disclosure.

FIG. 2C shows a configuration of a two-step switchable low dropout regulator LDO according to a third embodiment of the present disclosure.

Referring to FIG. 2C, an RF switch with the two-step switchable low dropout regulator LDO according to the third embodiment of the present disclosure may include:

- a low dropout regulator LDO which includes an amplifier Amp which outputs a gate signal in accordance with a difference between a reference voltage $V_{BGR}$ and a feedback voltage, a PMOS transistor PMOS which controls current between an input terminal IN which receives a power supply voltage $V_{DD}$(IN) in accordance with a gate signal and the ground, a fixed resistor $R_1$ which may adjust an output voltage, and a variable resistor $R_2$ which is controlled using an external output signal UV; and
- a low voltage lockout UVLO which includes a resistor $R_T$ having one side to which a power supply is connected, a resistor $R_B$ whose one side is connected in series to the other side of the resistor $R_T$ and whose other side is grounded, a current source $I_H$ whose one side is connected to a contact point of the resistor $R_B$ and the resistor $R_T$, a comparator 1 in which a voltage between the resistor $R_T$ and the resistor $R_B$ is input to an inverting input terminal, in which a reference voltage $V_{BGR}$ is input to a non-inverting input terminal, and which outputs a signal for controlling the variable resistor, and an NMOS transistor NMOS in which a drain is connected to an output side of the current source $I_H$, in which a source is grounded, in which an output of the comparator 1 is input to a gate so that the NMOS transistor NMOS is turned on/off, and wherein the low voltage lockout UVLO monitors the power supply voltage $V_{DD}$(IN) and outputs the monitored signal.

Referring to FIG. 2C, the RF switch with a two-step switchable low dropout LDO regulator according to the third embodiment of the present invention is similar to the first embodiment, except that the drain of the NMOS transistor NMOS is connected to the output side of the current source $I_H$ and the source is grounded.

Figure 3A:
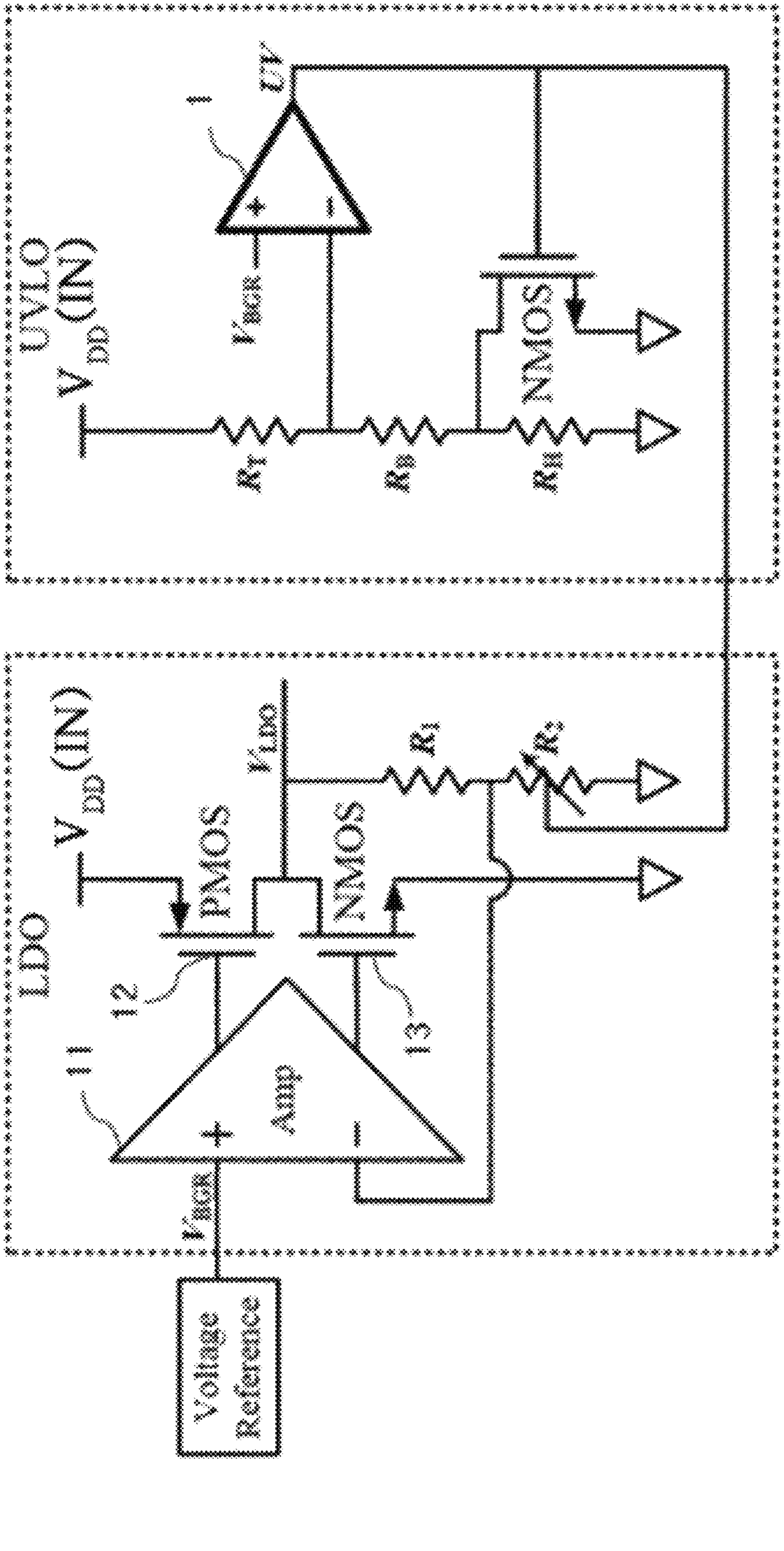
FIG. 3A shows a configuration of a low dropout regulator LDO with a two-step switchable Class-AB output stage according to a fourth embodiment of the present disclosure.

FIG. 3A shows a configuration of a low dropout regulator LDO with a two-step switchable Class-AB output stage according to a fourth embodiment of the present disclosure.

Referring to FIG. 3A, the RF switch with the two-step switchable low dropout regulator LDO of the fourth embodiment of the present disclosure may include:

- a low dropout regulator LDO which has a fixed resistor $R_1$ which may adjust an output voltage of a low dropout regulator LDO and a variable resistor $R_2$ which is controlled using an output signal of a low voltage lockout UVLO and has a Class-AB output stage; and the low voltage lockout UVLO which includes a resistor $R_T$ having one side to which a power supply is connected, a resistor $R_B$ whose one side is connected in series to the other side of the resistor $R_T$, a resistor $R_H$ whose one side is connected in series to the other side of the resistor $R_B$ and whose other side is grounded, a comparator 1 in which a voltage between the resistor $R_T$ and the resistor $R_B$ is input to a inverting input terminal, in which a reference voltage $V_{BGR}$ is input to a non-inverting input terminal, and which outputs a signal for controlling the variable resistor, and an NMOS transistor NMOS in which a drain is connected between the resistor $R_B$ and the resistor $R_H$, in which a source is grounded, and in which the output of the comparator 1 is input to the gate so that the NMOS transistor NMOS is turned on/off, wherein the low voltage lockout UVLO monitors the power supply voltage $V_{DD}$(IN) and outputs the monitored signal.

A Class-AB output stage 10 composed of an amplifier 11, a PMOS transistor 12, and an NMOS transistor 13 and the Class-AB output stage 10 is well known in this field as it utilizes the advantages of both a PMOS and a NMOS. Thus, a detailed description thereof is omitted.

The RF switch with a two-step switchable low dropout LDO regulator according to the fourth embodiment of the present invention is similar to the first embodiment, except that an amplifier 11, a PMOS transistor 12, and an NMOS transistor 13 of the Class-AB output stage 10 are added in place of the amplifier Amp and the NMOS transistor NMOS of the first embodiment.

The variable resistor $R_2$ may be controlled using the output signal of the low voltage lockout UVLO and the fixed resistor $R_1$ may regulate an output VLDO of the Class-AB output stage that is an output voltage of the low dropout regulator LDO.

Figure 3B:
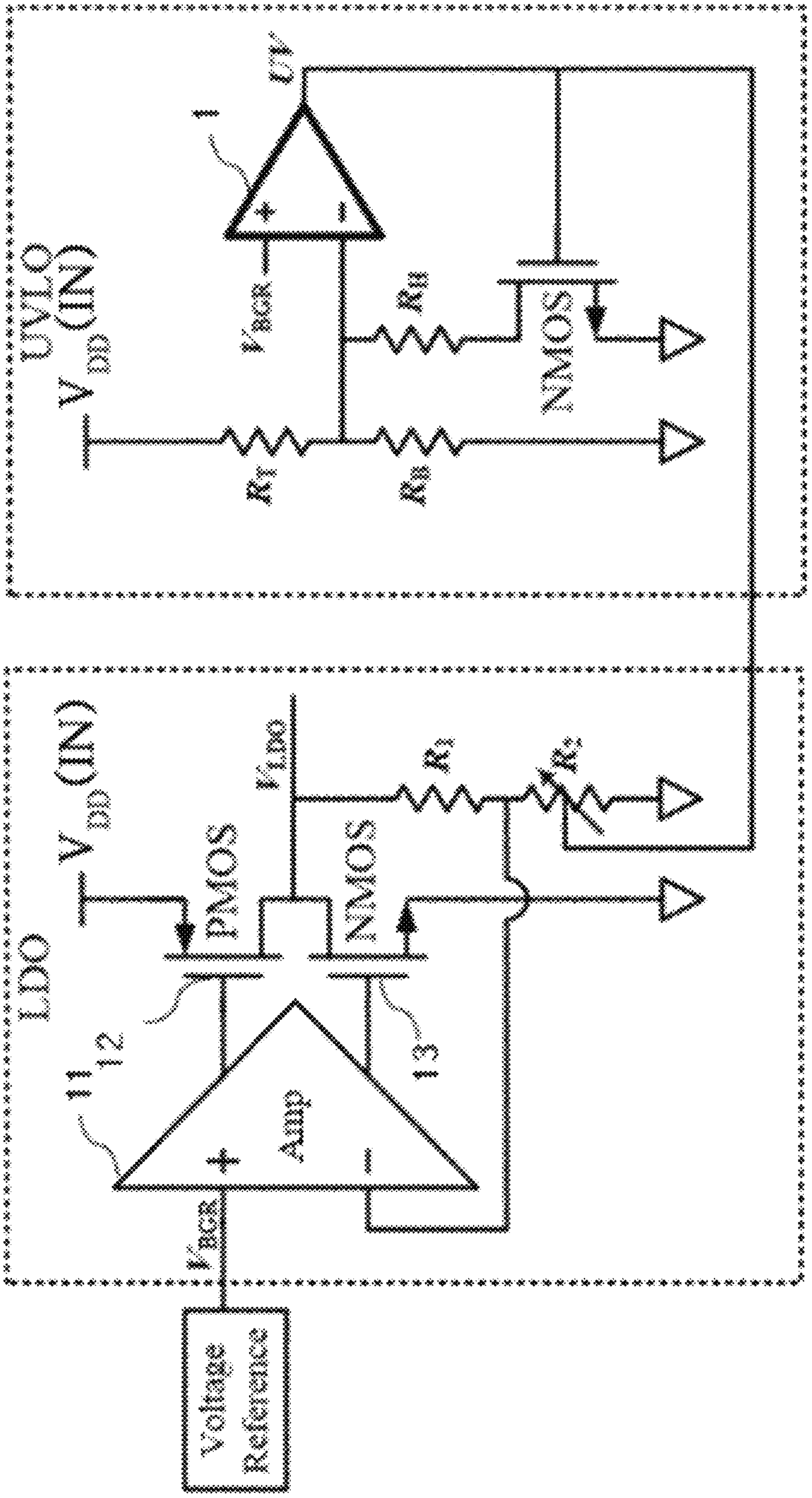
FIG. 3B shows a configuration of a low dropout regulator LDO with a two-step switchable Class-AB output stage according to a fifth embodiment of the present disclosure.

FIG. 3B shows a configuration of a low dropout regulator LDO with a two-step switchable Class-AB output stage according to a fifth embodiment of the present disclosure.

Referring to FIG. 3B, a RF switch with the two-step switchable low dropout regulator LDO according to the fifth embodiment of the present disclosure may include:

a low dropout regulator LDO which has a fixed resistor $R_1$ which may adjust an output voltage of the low dropout regulator LDO and a variable resistor $R_2$ which is controlled using an output signal of a low voltage lockout UVLO and has a Class-AB output stage; and the low voltage lockout UVLO which includes a resistor $R_T$ having one side to which a power supply is connected, a resistor $R_B$ whose one side is connected in series to the other side of the resistor $R_T$ and whose other side is grounded, a resistor $R_H$ whose one side is connected to a contact point of the resistor $R_B$ and the resistor $R_T$, a comparator 1 in which a voltage between the resistor $R_T$ and the resistor $R_B$ is input to an inverting input terminal, in which a reference voltage $V_{BGR}$ is input to a non-inverting input terminal, and which outputs a signal for controlling the variable resistor, wherein the low voltage lockout UVLO monitors the power supply voltage $V_{DD}$(IN) and outputs the monitored signal.

The RF switch with a two-step switchable low dropout LDO regulator according to the fifth embodiment of the present invention is similar to the second embodiment, except that an amplifier 11, a PMOS transistor 12, and an NMOS transistor 13 of the Class-AB output stage 10 are added in place of the amplifier Amp and the NMOS transistor NMOS of the second embodiment.

The variable resistor $R_2$ may be controlled using an output signal of the low voltage lockout UVLO and the fixed resistor $R_1$ may regulate an output VLDO of the Class-AB output stage that is an output voltage of the low dropout regulator LDO. Furthermore, the low voltage lockout UVLO may monitor the power supply voltage $V_{DD}$(IN) and output the monitored signal.

Figure 3C:
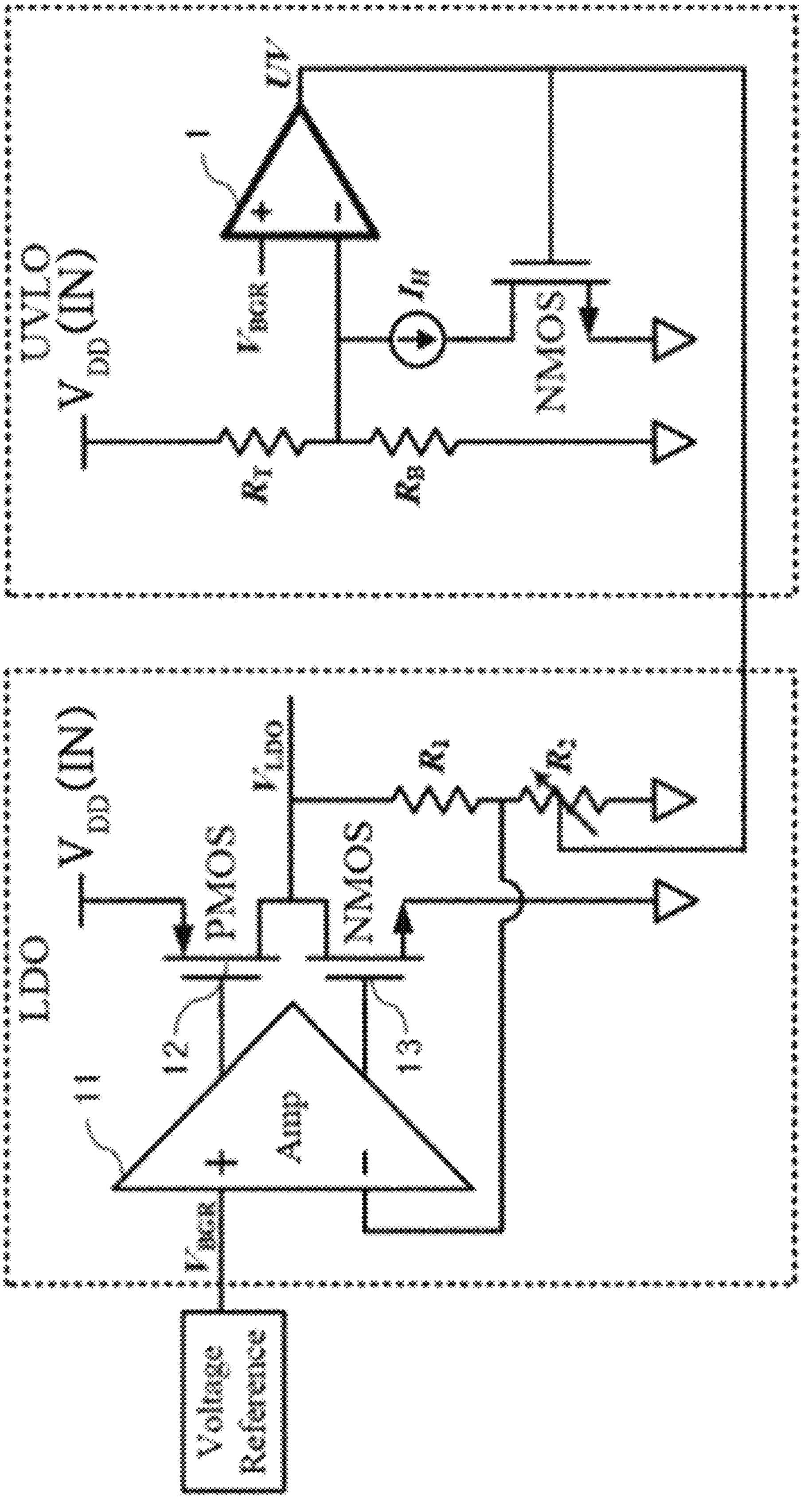
FIG. 3C shows a configuration of a low dropout regulator LDO with a two-step switchable Class-AB output stage according to a sixth embodiment of the present disclosure.

FIG. 3C shows a configuration of a low dropout regulator LDO with a two-step switchable Class-AB output stage according to a sixth embodiment of the present disclosure.

Referring to FIG. 3C, an RF switch with the two-step switchable low dropout regulator LDO according to the sixth embodiment of the present disclosure may include:

a low dropout regulator LDO which has a fixed resistor $R_1$ which may adjust an output voltage of the low dropout regulator LDO and a variable resistor $R_2$ which is controlled using an output signal of a low voltage lockout UVLO and has a Class-AB output stage; and the low voltage lockout UVLO which includes a resistor $R_T$ having one side to which a power supply is connected, a resistor $R_B$ whose one side is connected in series to the other side of the resistor $R_T$ and whose other side is grounded, a current source $I_H$ whose one side is connected to a contact point of the resistor $R_B$ and the resistor $R_T$, a comparator 1 in which a voltage between the resistor $R_T$ and the resistor $R_B$ is input to an inverting input terminal, in which a reference voltage $V_{BGR}$ is input to a non-inverting input terminal, and which outputs a signal for controlling the variable resistor, and an NMOS transistor NMOS in which a drain is connected to an output side of the current source $I_H$, a source is grounded, and an output of the comparator 1 is input to a gate so that the NMOS transistor NMOS is turned on/off, wherein the low voltage lockout UVLO monitors the power supply voltage $V_{DD}$(IN) and outputs the monitored signal.

The RF switch with a two-step switchable low dropout LDO regulator according to the sixth embodiment of the present invention is similar to the third embodiment, except that an amplifier 11, a PMOS transistor 12, and an NMOS transistor 13 of the Class-AB output stage 10 are added in place of the amplifier Amp and the NMOS transistor NMOS of the third embodiment.

The variable resistor $R_2$ may be controlled using an output signal of the low voltage lockout UVLO and the fixed resistor $R_1$ may regulate an output VLDO of the Class-AB output stage that is an output voltage of the low dropout regulator LDO.

Also, the low voltage lockout UVLO may monitor the power supply voltage $V_{DD}$(IN) and output the monitored signal.

In the embodiment of the present disclosure above, the output voltage is automatically varied even when the power supply voltage $V_{DD}$(IN) is lower than that of a conventional RF switch so that the low dropout regulator LDO always operates within an operating voltage range, thereby reducing noise coming into the power supply and reducing intermodulated clock noise of a negative voltage generator from flowing into the power supply.

It should be understood that an embodiment of the present disclosure described in this specification and the configurations illustrated in the drawings are merely examples of a preferred embodiment of the present disclosure and do not encompass all of the technical ideas of the invention and that various equivalents and modifications may be substituted for them at the time of filing. Thus, the present disclosure is not limited to the an embodiment and anyone with ordinary skill in the art to which the invention pertains may make various modifications without departing from the gist of the present disclosure claimed in the claims and such modifications are within the scope of the claims of the present disclosure.

Although an embodiment of the present disclosure has been described in detail above, the scope of the present disclosure is not limited thereto and various modifications and improvements made by those skilled in the art using the basic concept of the present disclosure defined in the following claims are also included in the scope of the present disclosure.

What is claimed is:

1. A radio frequency (RF) switch with a two-step switchable low dropout regulator LDO, the RF switch comprising:

the low dropout regulator LDO which includes an amplifier Amp which outputs a gate signal in accordance with a difference voltage between a reference voltage $V_{BGR}$ and a feedback voltage, a P-channel metal-oxide semiconductor (PMOS) transistor PMOS which controls current between an input terminal IN which receives a power supply voltage $V_{DD}$(IN) in accordance with the gate signal and a ground, a fixed resistor $R_1$ which controls an output voltage, and a variable resistor $R_2$ which is controlled using an external output signal UV; and a low voltage lockout UVLO which includes a resistor $R_T$ having one side to which a power supply is connected, a resistor RB whose one side is connected in series to the other side of the resistor $R_T$, a resistor $R_H$ whose one side is connected in series to the other side of the resistor $R_B$ and whose other side is grounded, a comparator 1 in which a voltage between the resistor $R_T$ and the resistor $R_B$ is input to an inverting input terminal, in which a reference voltage $V_{BGR}$ is input to a non-inverting input terminal, and which outputs a signal for controlling the variable resistor, and an N-channel metal-oxide semiconductor (NMOS) transistor NMOS in which a drain is connected between the resistor $R_B$ and the resistor $R_H$, a source is grounded, and an output of the comparator 1 is input to a gate so that the NMOS transistor NMOS is turned on/off, wherein the low voltage lockout UVLO monitors the power supply voltage $V_{DD}$(IN) and outputs the monitored signal.

* * * * *